United States Patent [19]

Petr

[11] Patent Number: 4,518,950

[45] Date of Patent: May 21, 1985

[54] DIGITAL CODE CONVERTER

[75] Inventor: David W. Petr, Red Bank, N.J.

[73] Assignee: AT&T Bell Laboratories, Murray Hill, N.J.

[21] Appl. No.: 435,968

[22] Filed: Oct. 22, 1982

[51] Int. Cl.³ ............................................ H03K 13/24
[52] U.S. Cl. .............................. 340/347 DD; 375/27; 375/34
[58] Field of Search ............ 340/347 DD; 332/11 D; 375/27, 26, 34; 381/30

[56] References Cited

U.S. PATENT DOCUMENTS

| 3,937,897 | 2/1976 | Song ........................... 340/347 DD |
| 3,949,299 | 4/1976 | Song ........................... 340/347 DD |
| 4,437,087 | 3/1984 | Petr ............................ 340/347 DD |
| 4,475,227 | 10/1984 | Belfield ....................... 340/347 DD |

OTHER PUBLICATIONS

"A Low Noise ADPCM-Log PCM Code Converter", 1979 International Symposium on Circuits and Systems, Proceedings, IEEE Catalog No. 79 CH1421-7 CAS, pp. 969-970, Jul. 17-19, 1979, by Hideyo Murakami.

Primary Examiner—Charles D. Miller
Attorney, Agent, or Firm—Thomas Stafford

[57] ABSTRACT

Accumulation of distortion possible from multiple digital code conversions is eliminated in an ADPCM coder that converts PCM incoming signals, e.g., $\mu$-law PCM to linear PCM and, then, to a quantized n-bit differential PCM output signal. Elimination of distortion accumulation in subsequent code conversion stages is realized in the coder when the differential PCM output is not on the most positive or most negative ADPCM quantizer steps by controllably modifying the coder differential PCM output so that a next subsequent coder would generate the same differential PCM value.

Accumulation of distortion in subsequent code conversions when the differential PCM coder output is either the most positive or most negative quantizer step is eliminated by controllably modifying a decoder output so that the next subsequent code converter will choose the same ADPCM code value.

11 Claims, 6 Drawing Figures

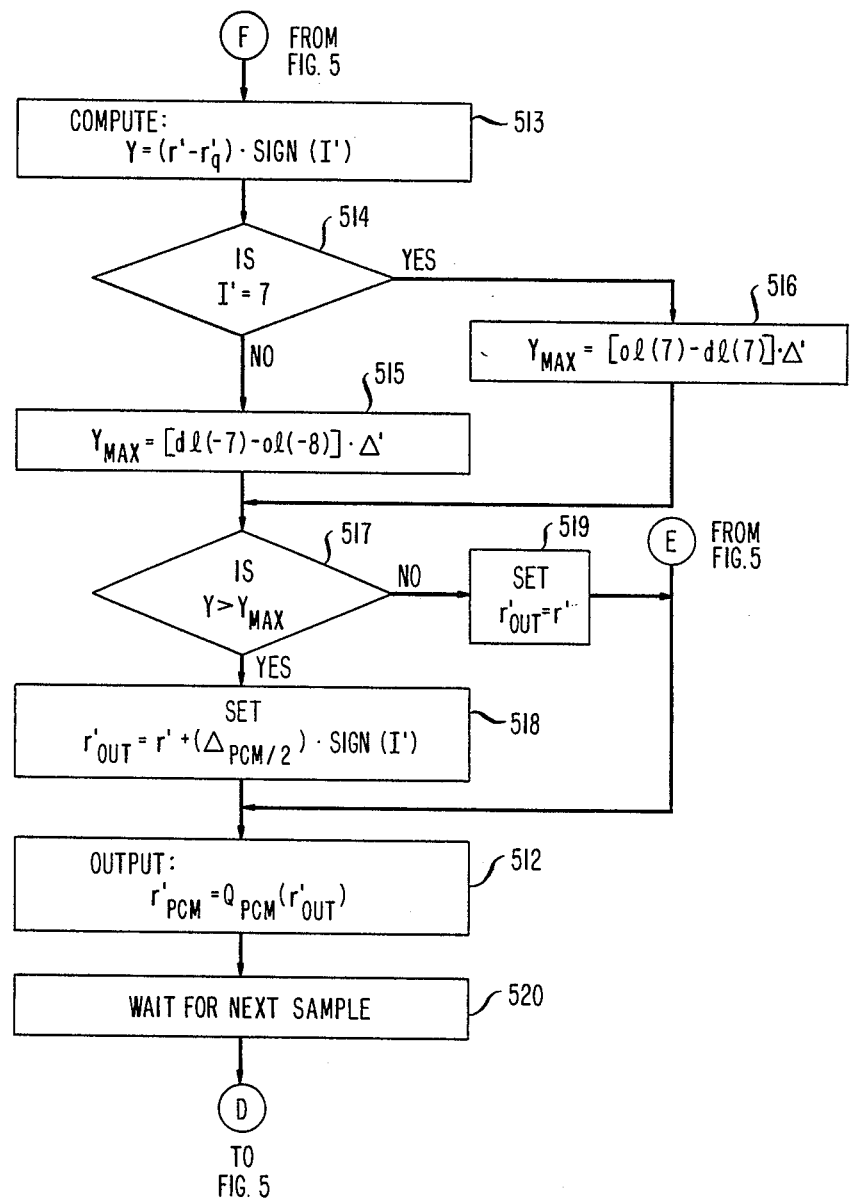

DIGITAL CODE CONVERTER

TECHNICAL FIELD

This invention relates to digital code conversion and, more particularly, to eliminating the accumulation of distortion in multiple code conversions.

BACKGROUND OF THE INVENTION

Over the past several years there has been, and continues to be, a tremendous amount of activity in the area of efficient encoding of speech. A large number of digital coding algorithms are being investigated for a wide variety of applications. For an evolving digital telephone network, a most important application is the possible replacement of 64,000 bit-per-second (b/s) PCM signal (8 bits per time slot, repeated at an 8 kHz rate) with other coding algorithms for telephone—both in the public switched and private line networks. The reason, of course, is to achieve bandwidth compression. The dilemma for telephony planners is easily posed but not so easily answered—should such a network evolve toward a coding algorithm more efficient than 64 kb/s PCM and, if so, which algorithm is preferable? A number of different digital coding algorithms and related techniques have been proposed heretofore, namely: Adaptive Differential PCM (ADPCM); Sub-Band Coding (SBC); Time Domain Harmonic Scaling (TDHS); vocoder-driven Adaptive Transform Coding (ATC), etc.

For a realistic mix of input speech and voiceband data, the ADPCM approach appears to be the most promising. One form of adaptive differential PCM coding is disclosed, for example, in my copending application Ser. No. 343,355, filed Jan. 27, 1982 now U.S. Pat. No. 4,437,087 and can be considered a benchmark since a single encoding with this coder at 32 kb/s is near to being subjectively equivalent to 64 kb/s $\mu$ 255 PCM. In some networks it is possible to have multiple conversions from 64 kb/s PCM-to-32 kb/s ADPCM-to-64 kb/s PCM. In these applications, it is important to eliminate accumulation of distortion in the multiple PCM-to-ADPCM-to-PCM code conversions.

An attempt towards this goal is described in an article by Hideyo Murakami entitled, "A Low Noise ADPCM-LOG PCM Code Converter", 1979 *International Symposium on Circuits and Systems Proceedings*, IEEE catalog No. 79 CH1421-7 CAS, pages 969-970. However, this arrangement assumes a uniform ADPCM quantizer and distortion could result in those applications in which a non-uniform quantizer is employed.

SUMMARY OF THE INVENTION

The accumulation of distortion in multiple digital code conversions is eliminated, in accordance with an aspect of the invention, by including in a coder for converting digital signals from a first code to a second code arrangement for controllably modifying the first-to-second code conversion in accordance with prescribed criteria dependent on the first and second coding methods. More specifically, based on a preliminary conversion from the first code to the second code and on the first coding method, for example, $\mu$-law PCM, the second code sample value for example, ADPCM, are modified in accordance with the prescribed criteria so that a next subsequent coder will ultimately select the same second code sample as selected by the first coder for transmission. The prescribed criteria includes, in accordance with an aspect of the invention, selecting between a preliminary second code sample value and its adjacent values by evaluating at least one second-to-first code conversion quantization error value. In one example, the prescribed criteria includes a first criterion of determining whether the preliminary second code value and either of the second code values adjacent to the preliminary value would generate the same first code value after converting from the second code to the first code and a second criterion of determining whether the quantizing error generated from converting from the second code to the first code is greater for the preliminary second code value or for an adjacent second code value meeting the first criterion requirements. If the quantizing error is greater for the preliminary value, the second code value is modified in the first coder to be the adjacent second code value that met the first criterion, requirement. If the quantizing errors are equal, then the more positive of the preliminary second code sample value and the adjacent second code sample value that met the first criterion is selected as the coder second code output sample value.

BRIEF DESCRIPTION OF THE DRAWING

The invention will be more fully understood from the following detailed description of an illustrative embodiment taken in connection with the appended figures in which:

FIGS. 5 and 6 show a flow chart describing operation of the decoder of the invention.

DETAILED DESCRIPTION

Figure 1:
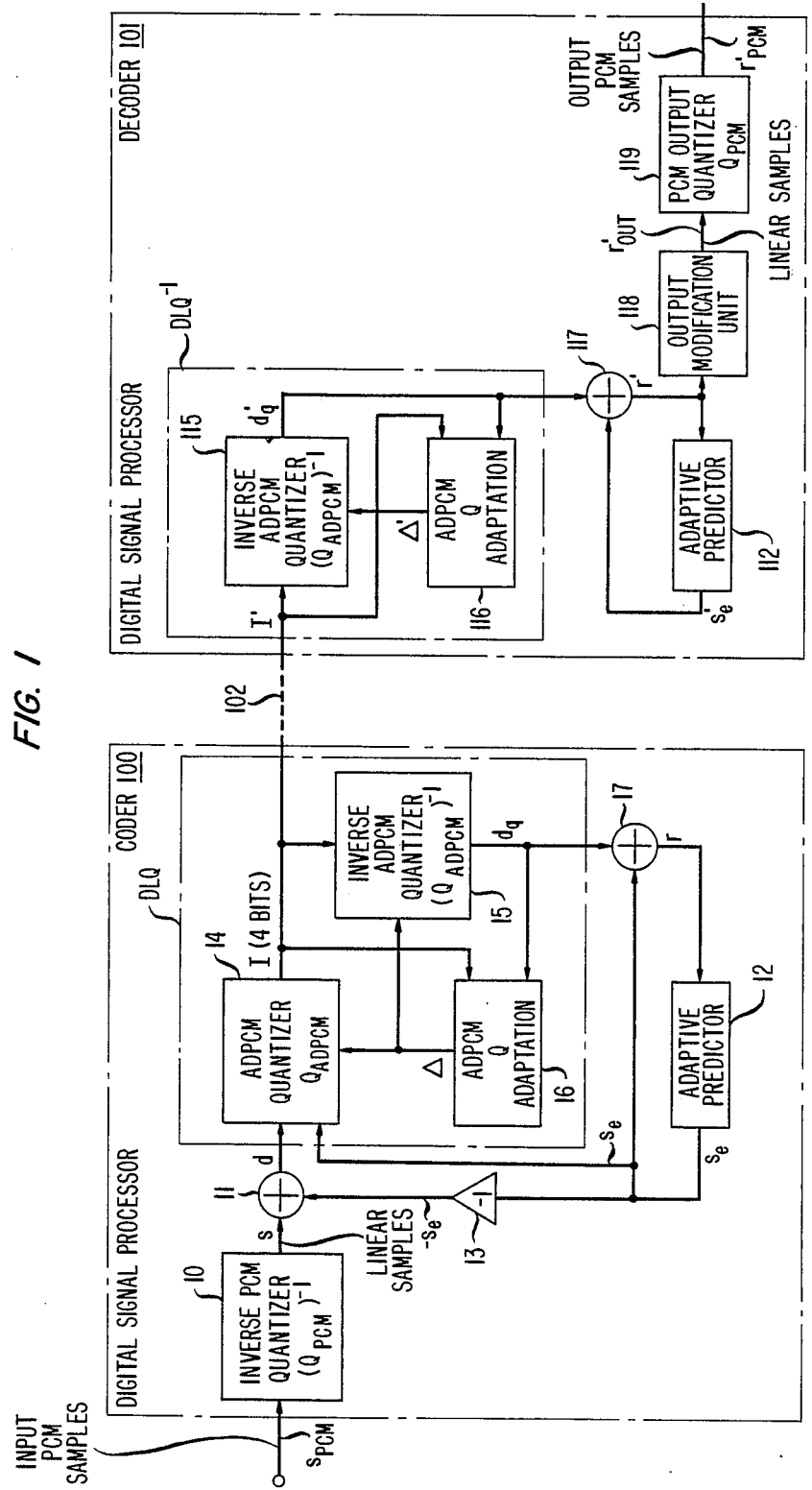
FIG. 1 shows in simplified block diagram form a code converter including an embodiment of the invention.

FIG. 1 illustrates in simplified block diagram form coder 100 including an aspect of the invention which receives input samples $s_{PCM}$ of a first code, for example, $\mu$225 PCM and encodes the same into a second code, for example, n-bit differential PCM. The second code signal is transmitted over transmission facility 102 to decoder 101. Decoder 101 converts the second code signal into a signal in the first code, namely $r'_{PCM}$. For purposes of illustration, a 4-bit differential PCM signal (n=4) shall be assumed. This 4-bit differential signal in conjunction with applicant's ADPCM coding algorithm provides very reliable, robust transmission for both speech and higher speed, voiceband data (e.g., 4800 b/s)—as well, of course, for lower speed data and tone signals. However, it is to be understood that the invention is in no way limited to this 4-bit differential transmission and n could be any other number, e.g., n=2, n=3, n=5, etc. If the input PCM samples were always representative of encoded speech, then a 2-bit differential PCM signal (i.e., n=2) should prove adequate for many applications.

Accordingly, PCM input samples are supplied to inverse PCM quantizer $(Q_{PCM})^{-1}$ 10 which converts the PCM samples, for example, $\mu$225 PCM, to multi-bit linear PCM samples in well-known fashion. The multi-bit (e.g., 13–16 bits) linear PCM samples (s) are delivered to algebraic adder or difference circuit 11. It is noted that samples s are not limited to PCM and could also be PAM samples. Alternatively, the linear PCM samples may result from the direct encoding of an input speech signal or voiceband data to linear PCM. And, of course, other non-uniform signals such as an A-law PCM signal may also first have to be converted to its linear PCM counterpart. Such conversions are known in the art and comprise no part of the present invention.

Adaptive predictor 12 provides a predicted signal estimate ($s_e$) which is a prediction or an estimate of sample s. Ths predicted signal estimate (s) is inverted in inverter 13 to obtain $-s_e$, which is delivered to the other input of the adder circuit 11. Accordingly, adder 11 provides at its output a difference signal (d) that is the algebraic addition of the two inputs thereto, namely, $s-s_e$. Adaptive predictors which may be advantageously employed herein are disclosed in my copending application Ser. No. 343,355 cited above and copending application Ser. No. 368,394, filed Apr. 14, 1982.

Figure 4:
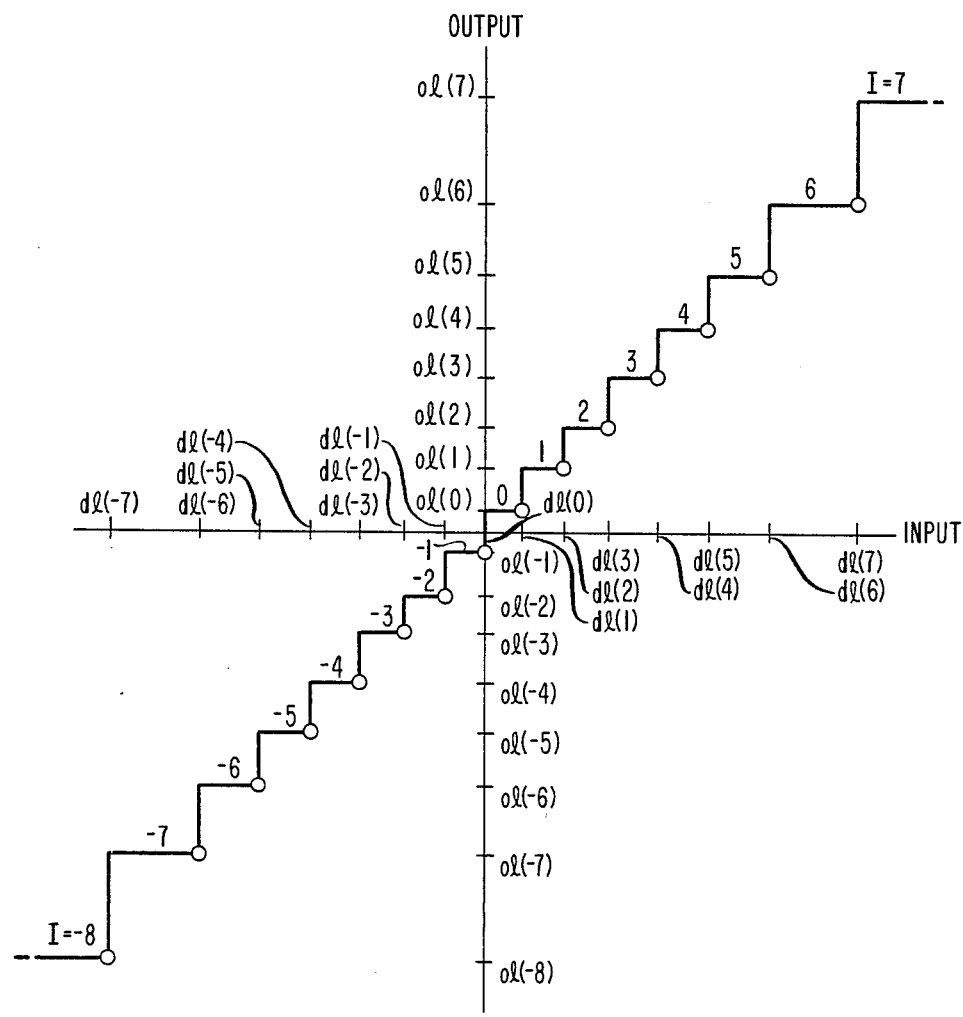
FIG. 4 illustrates in graphical form an unscaled nonuniform quantizer characteristic useful in describing the invention.

Difference signal d is coupled to the input of the dynamic locking quantizer (DLQ) including an aspect of the invention. The DLQ comprises a 16 level (for n=4) non-uniform ADPCM quantizer 14 of scale factor $\Delta$. One example of a non-uniform ADPCM quantizer characteristic is shown in FIG. 4. It is noted, however, that the invention is not dependent on the specific type of ADPCM quantizer characteristic. As will be appreciated by those skilled in the art, ADPCM quantizer 14 not only provides the desired quantization, but it also serves to PCM encode the input signal; the quantizing and encoding are carried out in one-and-the-same operation. The 4-bit output signal (I) represents the quantized and PCM encoded form of the difference sample d. Such quantizer arrangements are known in the art. Quantizer 14 also includes, in accordance with an aspect of the invention, an arrangement to be described in detail hereinafter for controllably modifying the PCM to ADPCM code conversion in accordance with the prescribed criteria to eliminate accumulation of distortion in subsequent conversions from PCM to ADPCM. To this end, difference signal d and predicted signal $s_e$ are supplied to quantizer 14.

The 4-bit PCM output (I) is delivered to inverse ADPCM quantizer $(Q_{ADPCM})^{-1}$ 15 which, as the designation implies, performs an operation that is essentially the inverse of the operation of ADPCM quantizer 14. That is, inverse ADPCM quantizer 15 receives the 4-bit differential PCM signal (I) and provides at its output signal $d_q$. This $d_q$ signal is the quantized version of difference signal d. Signal $d_q$ is coupled to the input of ADPCM Q adaptation circuit 16 and to adder 17. The $s_e$ output of adaptive predictor 12 is also coupled to an input of adder 17 and to ADPCM quantizer 14. Adder 17 adds the $d_q$ and $s_e$ signals to generate at its output reconstructed signal r which is in linear PCM form. Reconstructed signal r is delivered to adaptive predictor 12, which in response thereto serves to generate the next predicted signal for comparison with the next linear PCM sample. The adaptive predictor 12 uses reconstructed signal sample r and a few previous samples to arrive at prediction $s_e$ which is the weighted sum of m input samples (e.g., m=4).

ADPCM Q adaptation circuit 16 receives quantized difference signal $d_q$ and the 4-bit output I and serves to develop therefrom adaptive scale factor $\Delta$. This scale factor ($\Delta$) is then delivered to ADPCM quantizer 14 and inverse quantizer 15. Adaptive scale factor $\Delta$ serves to scale the $Q_{ADPCM}$ and $(Q_{ADPCM})^{-1}$ characteristics to match the power of input difference signal d. ADPCM Q adaptation circuit 16 controls the speed of adaption of the scale factor $\Delta$; a fast speed of adaptation is provided when the input linear PCM signal represents speech, with a very slow (almost constant) speed of adaptation for input PCM encoded voiceband data or tones as described in my copending application Ser. No. 343,355 cited above.

The 4-bit differential PCM signal (I) is transmitted, in typical time-division multiplexed fashion, over the digital transmission facility 102 and is delivered to the input of inverse ADPCM quantizer 115. This input signal is designated I', the prime indicating that it is close to and yet, perhaps, not identical with the signal I due to transmission errors. Similarly, the other letter symbols used in decoder 101 are primed to indicate that they are close to but perhaps not identical with the similarly designated symbols or signals of coder 100. Inverse ADPCM quantizer 115 is identical to ADPCM inverse quantizer 15 and it serves to provide at its output the quantized signal $d_q'$. Again, as before $d_q'$ represents the quantized version of the difference signal d, with the prime indicating a possible variation from signal $d_q$ due to transmission errors. The quantized signal $d_q'$ is coupled to the input of ADPCM Q adaptation circuit 116 and adder 117. The input differential PCM signal I' is also coupled to the input of ADPCM Q adaptation circuit 116; this circuit is identical to ADPCM Q adaptation circuit 16 of coder 100. The output of ADPCM Q adaptation circuit 116 is the adaptive scale factor $\Delta'$ which is delivered to the inverse ADPCM quantizer 115 for the same purpose as previously described. ADPCM quantizer 115 and ADPCM Q adaptation 116 form inverse dynamic locking quantizer $DLQ^{-1}$ which performs the function of generating $d_q'$. Adaptive predictor 112 serves to generate predicted signal $s_e'$ which is coupled to the other input of adder 117. Adaptive predictor 112 is identical to adaptive predictor 12 of coder 100. Adder 117 serves to digitally add input signals $d_q'$ and $s_e'$ to produce reconstructed signal r' which is a close quantized version of the original input signal s. Reconstructed signal r' is delivered to the input of adaptive predictor 112 and to output modification unit 118 for generating a modified version of reconstructed signal r', namely, $r'_{out}$. As will be described in more detail hereinafter modification unit 118 includes an arrangement for modifying, if necessary, reconstructed signal r' in accordance with prescribed criteria when received differential PCM signal I' is the most positive or most negative ADPCM quantizer step. This ensures that a next subsequent coder will choose the same ADPCM quantizer step. "Modified" reconstructed signal $r'_{out}$ is then PCM quantized via PCM output quantizer 119 for use as directed.

Coder 100 and decoder 101 are shown in FIG. 1 in block diagram form to facilitate clarity of description. However, coder 100 and decoder 101 are implemented, in this example, in a digital signal processor (DSP), i.e., a programmable integrated circuit for signal processing. Any one of a number of digital signal processing units known in the art may be employed for this purpose. One such DSP unit is described in several articles in *The Bell System Technical Journal,* Vol. 60, No. 7, Part 2, dated September 1981 and is manufactured by Western Electric Company.

Accordingly, coder 100 including an aspect of the invention is realized by programming a DSP unit. Operation of coder 100, in accordance with an aspect of the invention, is described in conjunction with the digital program flow chart of FIGS. 2 and 3.

Figure 2:
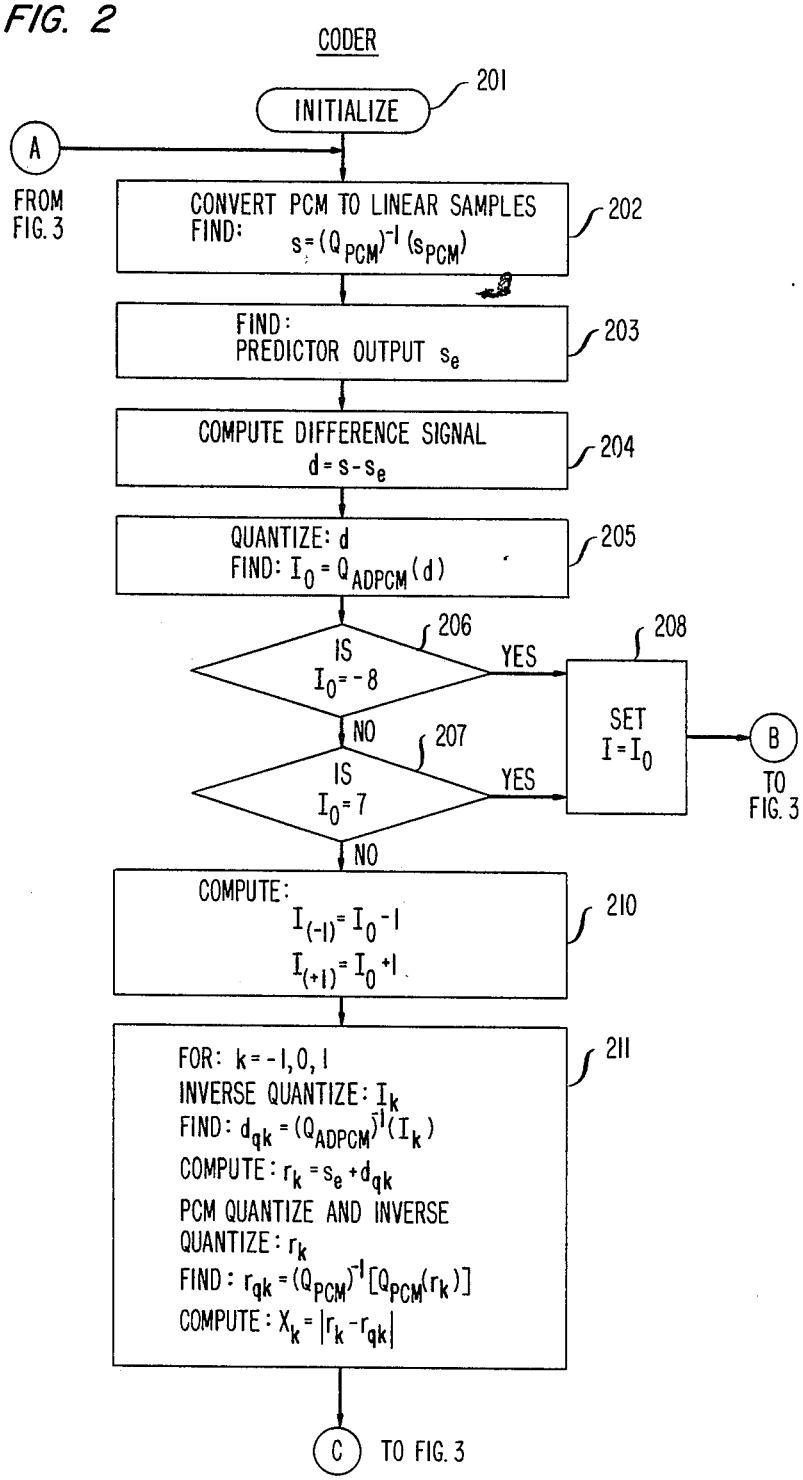
FIGS. 2 and 3 depict a flow chart describing the operation of the coder of the invention.
Figure 3:
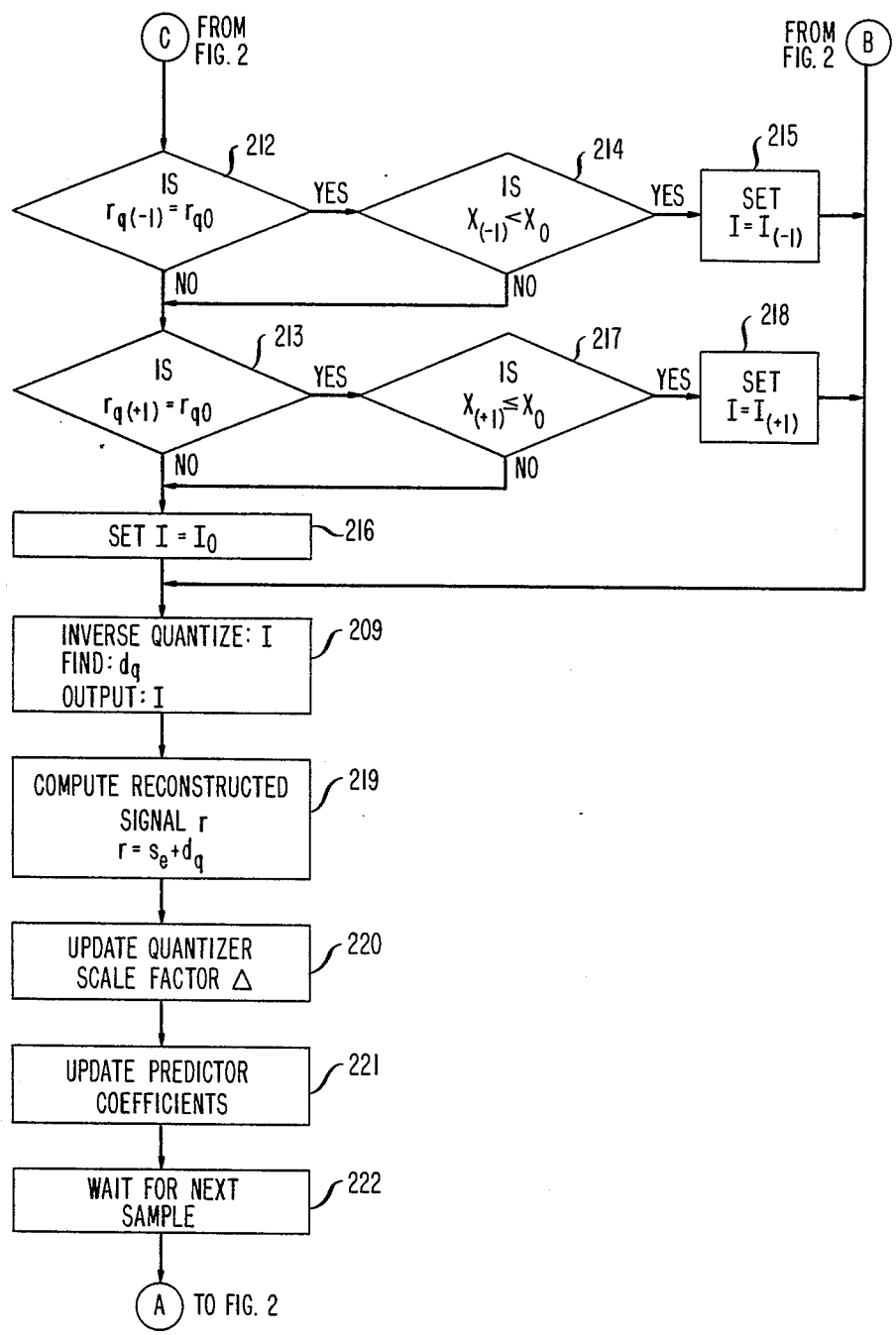

FIGS. 2 and 3 when connected A—A, B—B and C—C form a flow chart of a program routine for converting digital signals from a first code, e.g., μ-law PCM, to a second code, e.g., ADPCM. Accordingly, the DSP is initialized via 201. Thereafter, received PCM samples $s_{PCM}$ are converted in operational block 202 to linear PCM samples s. Then, the predictor output estimate $s_e$ is computed via operational block 203. As noted above, details of the predictor computation are described in my copending application Ser. No. 343,355. Operational block 204 causes the computation of difference signal d, which comprises the algebraic combination of linear samples s and predicted estimate $-s_e$, namely, $d=s-s_e$. Difference signal d is quantized via operational block 205, for example, in accordance with the ADPCM quantizer characteristic of FIG. 4, to obtain a preliminary 4-bit differential PCM output $I_0$. Output $I_0$ is tested in conditional branch point 206 to determine whether it is the most negative most quantizer step value, in this example, step −8 of FIG. 4. If the test result is NO, control is transferred to conditional branch point 207. If the test result in step 206 is YES, control is transferred to operational block 208 which sets the 4-bit differential PCM value $I=I_0$. Thereafter, control is transferred to operational block 209 of FIG. 3. Similarly, conditional branch point 207 tests to determine if $I_0$ is the most positive ADPCM quantizer step, in this example, step 7 of FIG. 4. If the test result is NO, control is transferred to operational block 210. However, if the test result in step 207 is YES, operational block 208 again sets $I=I_0$ and control is thereafter transferred to operational block 209. Steps 206, 207 and 208 are used when the ADPCM quantizer 14 (FIG. 1) generates an output I that is on the so-called saturated portion of the quantizer characteristic. Any possible distortion accumulation from subsequent code conversions is eliminated in decoder 101 in the saturated portion of the quantizer characteristic as described below.

If the results of the tests in steps 206 and 207 are NO, then the ADPCM output I is not in saturation and any possible accumulation of distortion in subsequent code conversion stages is eliminated in accordance with an aspect of the invention as described hereinafter. To this end, operational block 210 causes the ADPCM quantizer steps adjacent $I_0$ to be computed, namely, $I_{(-1)}=I_0-1$ and $I_{(+1)}=I_0+1$. Operational block 211 causes each of ADPCM quantizer steps $I_k$, $k=-1, 0, +1$ to be inverse ADPCM quantized to generate corresponding values $d_{qk}$, $k=-1, 0, +1$. Then, reconstructed signals $r_k=s_e+d_{qk}$, $k=-1, 0, +1$ are computed. The reconstructed signals $r_k$, $k=-1, 0, +1$, are PCM quantized and inverse PCM quantized to generate corresponding values $r_{qk}$, $k=-1, 0, +1$. Thereafter, quantizing error values $X_k=r_k-r_{qk}$ are generated for $k=-1, 0, +1$. Values $r_{qk}$ correspond to linear PCM signals $s_k$ which would be generated in response to ADPCM values I, being transmitted via 102, decoded in decoder 101, again PCM quantized via 119, transmitted to a subsequent coder 100 and inverse PCM quantized via 10 to linear PCM samples $s_k$.

Conditional branch point 212 tests whether $r_{q(-1)}=r_{q0}$. If the test result is NO, control is transferred to conditional branch point 213. If the test result is YES, conditional branch point 214 tests whether $X_{(-1)}<X_0$. If this test result in step 214 is NO, control is transferr to conditional branch point 213. If the step 214 test result is YES, operational block 215 sets $I=I_{(-1)}$ and control is transferred to operational block 209. Conditional branch point 213 tests whether $r_{q(+1)}=r_{q0}$. If this test result is NO, control is transferred to operational block 216. If the step 213 test result is YES, conditional branch point 217 tests whether $X_{(+1)}\leq X_0$. If the test result in step 217 is NO, control is transferred to operational block 216. If the test result in step 217 is YES, operational block 218 sets $I=I_{(+1)}$ and control is transferred to operational block 209. Operational block 216 sets $I=I_0$.

In summary, program steps 205–208 and 210–218 are included in ADPCM quantizer 14 FIG. 1 for generating ADPCM output I, in accordance with an aspect of the invention, to eliminate distortion in subsequent code conversions, i.e., PCM-to-ADPCM-to-PCM. Specifically, steps 210 through 218 are employed to determine in accordance with the prescribed criteria including a first criterion of determining whether preliminary ADPCM value $I_0$ and either of its adjacent values $I_{(-1)}$ or $I_{(+1)}$ would generate the same PCM value, namely, $r'_{PCM}$ or alternately $r'_q$ which corresponds to linear PCM samples s a subsequent coder 100, and a second criterion of determining whether the quantizing error $X=|r-r_q|$ generated from converting the ADPCM sample to PCM is greater for preliminary value $I_0$ or either adjacent value $I_{(-1)}$ or $I_{(+1)}$ which meets the requirement for the first criterion. When the quantizing error associated with $I_0$ and either $I_{(-1)}$ or $I_{(+1)}$ that met the first criterion is equal, then the more positive value is selected for the ADPCM output sample I.

The prescribed criteria is, for example, generating a preliminary ADPCM value $I_0$ (step 205), obtaining the adjacent ADPCM quantizer step values $I_{(-1)}$ and $I_{(+1)}$ (step 210), generating for $I_{(-1)}$, $I_0$ and $I_{(+1)}$ a corresponding linear PCM value that a subsequent code converter would generate if $I_{(-1)}$, $I_0$ or $I_{(+1)}$ were decoded via decoder 101 converted to PCM, transmitted to a subsequent coder and inverse PCM quantized to linear form in the subsequent coder (step 211) to yield $r_{q(-1)}$, $r_{q0}$ and $r_{q(+1)}$. Then, the linear PCM value $r_{q(-1)}$ is checked against $r_{q0}$ (step 212); if $r_{q(-1)}$ is not equal to $r_{q0}$ the linear PCM value $r_{q(+1)}$ is checked against $r_{q0}$ (step 213); if $r_{q(+1)}$ is not equal to $r_{q0}$ $I=I_0$ (step 216). If the linear PCM value $r_{q(-r)}=r_{q0}$, the magnitude of the difference between the reconstructed signal $r_{(-1)}$ and the subsequent converted linear PCM value $r_{q(-1)}$, i.e., quantizing error $X_{(-1)}$ is compared to quantizing error $X_0$ and if $X_{(-1)}<X_0$ (step 214) then $I=I_{(-1)}$. Similarly, if $X_{(-1)}$ is not less than $X_0$ and $r_{q(+1)}=r_{q0}$ ( step 213) the quantizing error value $X_{(+1)}$ is compared to $X_0$ and if $X_{(+1)}\leq X_0$, $I=I_{(+1)}$, otherwwise $I=I_0$.

Operational block 209 causes I to be inverse quantized to find value $d_q$ and, then, the 4-bit differential PCM output I is outputted. Operational block 219 causes reconstructed signal r to be computed by adder 17, namely, $r=s_e+d_q$. Scale factor Δ is updated in operational block 220 in known fashion. It is noted, however, that certain values of scale factor Δ may need to be excluded from use for proper operation of the invention. This is realized by simply excluding those values. Lastly, the adaptive predictor coefficients are updated in operational block 221. Once 221 is completed, the coder waits in block 222 for the next input sample and, then, the entire process is repeated again.

Operation of decoder 101 in generating a reconstructed μ-law PCM signal $r'_{PCM}$ from received ADPCM signal I' is described below in conjunction with the digital program flow chart shown in FIGS. 5 and 6.

Figure 5:
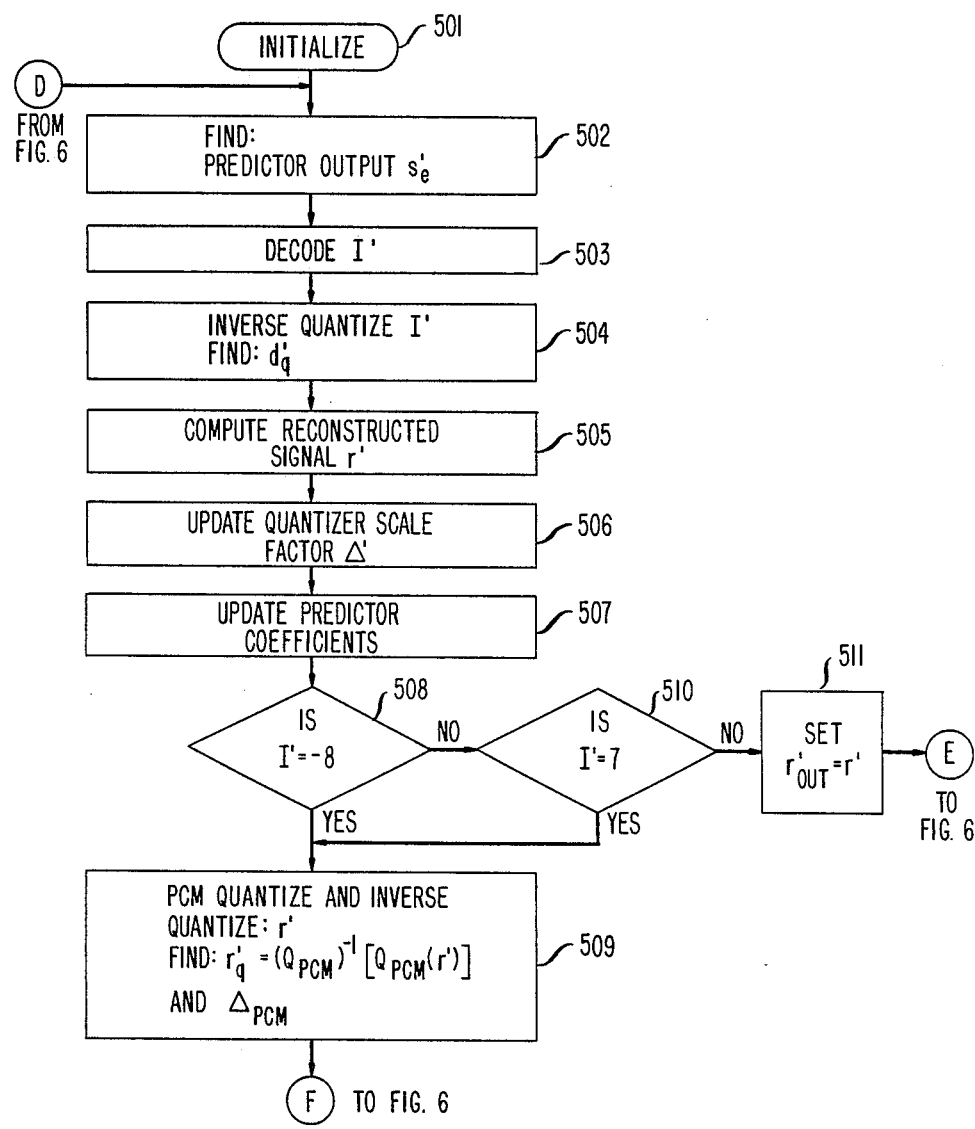

FIGS. 5 and 6 when connected D—D, E—E and F—F form a flow chart of a program routine illustrating operation of decoder 101. Accordingly, a DSP unit is initialized via 501 and, thereafter, predictor output estimate $s_e'$ is generated by operational block 502 in essentially the same manner as step 203 of FIG. 2. Operational block 503 relates to the reception and decoding of the 4-bit differential PCM signal I', followed by the generation or "finding" of the inverse quantized version of I' or the quantized version of difference signal, $d_q'$ in similar fashion to step 209 of FIG. 2. Operational block 505 causes reconstructed signal r' to be computed in similar fashion to step 219 of FIG. 3. Operational block 505 causes reconstructed signal r' to be computed in similar fashion to step 219 of FIG. 3. Similarly, operational block 506 causes ADPCM quantizer scale factor $\Delta'$ to be updated, also in similar fashion to step 220 of FIG. 3. Adaptive predictor coefficients are updated in operational block 507 in a manner similar to step 221 of FIG. 3.

Conditional branch point 508 tests to determine whether I' is the most negative ADPCM quantizer step, in this example, step —8. If the test result is YES, control is transferred to operational block 509. If the test result in step 508 is NO, conditional branch point 510 tests to determine whether I' is the most positive ADPCM quantizer step. If the step 510 test result is YES, control is transferred to operational block 509. If the step 510 test result is NO, I' is not on the saturated portion of the ADPCM quantizer characteristic and any possible distortion accumulation was eliminated, in accordance with an aspect of the invention in coder 100. Additionally, control is transferred to operational block 511 and since no modification is necessary $r'_{out}$ is set to be equal to reconstructed signal r'. Thereafter, control is transferred to operational block 512 of FIG. 6.

Operational block 509 causes reconstructed signal r' to be PCM quantized, e.g., $\mu$225 PCM and then to be inverse PCM quantized to obtain linear PCM samples, namely, $r'_q = (Q_{PCM})^{-1}[Q_{PCM}(r')]$. Again $r'_q$ is equivalent to a linear PCM sample s which a next coder 100 would generate from a PCM sample generated from reconstructed signal r'. Additionally, operational block 509 determine or "finds" $\Delta_{PCM}$ which is the PCM quantization interval or "step size" corresponding to $r'_q$.

Operational block 513 (FIG. 6) causes $Y = (r' - r'_q) \cdot \text{sign}(I')$ to be computed. Value Y is the difference between the reconstructed signal r' generated in decoder 101 in response to I' and a linear PCM sample $r'_q$ which a subsequent coder 100 would generate after inverse PCM quantizing a received PCM version of r', this difference then being multiplied by the algebraic sign of I'. This value Y is used to determine whether reconstructed signal r' is sufficiently different from the value $r'_q$ which a subsequent coder would generate to require modification. Conditional branch point 514 tests to determine whether I' is on the most positive ADPCM quantizer step, in this example, step 7. If the test result is NO, I' on the most negative ADPCM quantizer step, in this example, step —8, and control is transferred to operational block 515. If the step 514 test result is YES, control is transferred to operational block 516 and $Y_{MAX} = [ol(7) - dl(7)] \cdot \Delta'$ is computed for positive step 7 of the ADPCM quantizer characteristic used in this example, where ol(7) is the output level for step 7 and dl(7) is the decision level for step 7 of the ADPCM quantizer characteristic shown in FIG. 4. $Y_{MAX}$ is the maximum value of the difference between reconstructed signal r' and signal $r'_q$ allowable before r' must be modified. Thereafter, control is transferred to conditional branch point 517.

Operational block 515 causes $Y_{MAX} = [dl(-7) - ol(-8)] \cdot \Delta'$ to be generated for the most negative step, i.e., step —8, of the ADPCM quantizer characteristic used in this example as shown in FIG. 4.

Conditional branch point 517 tests to determine if $Y > Y_{MAX}$. If the test result is NO, Y is less than $Y'_{MAX}$ and no modification of reconstructed signal r' is necessary. Accordingly, operational block 519 sets $r'_{out} = r'$ and control is transferred to operational block 512. If the test result of step 517 is YES, the difference between r' and $r'_q$ is too great and reconstructed signal r' requires modification. Accordingly, operational block 518 causes $r'_{out} = r' + (\Delta_{PCM}/2) \cdot \text{sign}(I')$ to be generated, in accordance with an aspect of the invention. Thus, it is seen that if differential PCM value I' is on the most positive or most negative ADPCM quantizer characteristic step and the difference between the reconstructed signal r' generated in decoder 101 and the linear PCM value $r'_q$ that would be generated by a subsequent coder is greater than a prescribed value, the value of r' is controllably modified by a prescribed positive value if I' is on the most positive ADPCM quantizer characteristic step or by a prescribed negative value if I' is on the most negative ADPCM quantizer characteristic step.

Operational block 512 causes $r'_{out}$ to be PCM quantized for transmission. For example $r'_{PCM} = Q_{PCM}(r'_{out})$, where $r'_{PCM}$ is a $\mu$225 PCM sample value. Thereafter, decoder 101 waits in operational block 520 for the next ADPCM input sample I' and, then, the entire decoder process is repeated.

The above arrangements are only examples of embodiments of the invention. It will be apparent to those skilled in the art that various changes in form and detail may be made without departing from the spirit or scope of the invention. Indeed, other than $\mu$-law PCM and ADPCM code schemes may be used. Moreover, although the illustrative embodiment employs an ADPCM quantizer characteristic that has the decision levels (dl) midway between output levels (ol), the invention is equally applicable to more general relationships between the decision levels and the output levels. Indeed, either quantizer may have any non-uniform or uniform characteristic. Additionally, the first-to-second code converter need not be an ADPCM coder; other coding techniques which employ a quantizer for converting a first code to a second code could also be used. Examples include, but are not limited to, Differential PCM (DPCM) with a fixed quantizer and adaptive PCM (APCM) with no prediction.

What is claimed is:

1. A coder for converting digital samples from a first code to a second code including,
   means for converting samples in said first code to linear versions thereof,
   quantizer means supplied with said linear first code samples for generating corresponding samples in said second code, said quantizer means characterized by,
   means for controllably modifying said second code sample values, in accordance with prescribed criteria including selecting between a preliminary second code sample value and second code sample values adjacent to said preliminary second code sample value generated by said quantizer means by evaluating at least one second-to-first code conversion quantization error value, so that a next subsequent coder will ultimately generate the same value second code samples as said quantizer means.

2. The coder is defined in claim 1 wherein said prescribed criteria further includes a determination of whether the next subsequent coder would ultimately generate a second code sample value different than said preliminary second code sample value and, if so, then said quantizer means second code sample value is modified to be one of said adjacent second code sample values so that said subsequent coder will ultimately generate the same value second code sample value as said quantizer means.

3. The coder is defined in claim 1 wherein said first code is pulse code modulation (PCM) and said second code is adaptive differential PCM (ADPCM).

4. The coder is defined in claim 1 wherein said modifying means includes means for generating first code values for said preliminary and adjacent second code sample values means for comparing said preliminary first code sample value to said adjacent first code sample values, first means for selecting said preliminary second code sample value as said quantizer means second code output sample if neither of said adjacent first code sample values is equal to said preliminary first code sample value, and second means for selecting between said preliminary second code sample value and one of said adjacent second code sample values as said quantizer means second code output sample when said adjacent first code sample value corresponding to said one of said adjacent second code sample values is equal to said preliminary first code sample value.

5. The coder as defined in claim 4 wherein said second selecting means includes means for generating a quantizing error value for each of said preliminary and adjacent second code sample values resulting from generating said preliminary and adjacent first code sample values, means for determining whether said preliminary second code sample quantizing error is greater than said quantizing error associated with said adjacent second code sample corresponding to said equal adjacent first code sample value, means for selecting said adjacent second code sample corresponding to said equal adjacent first code sample value as said quantizer means second code output sample when said quantizing error associated with said preliminary second code sample value is greater than the quantizing error associated with said adjacent second code sample value corresponding to said equal adjacent first code sample value and for selection of said preliminary second code sample value when its associated quantizing error is less than said quantizing error associated with said equal adjacent first code sample value, and means for selecting the more positive value of said preliminary second code sample value and said adjacent second code sample value corresponding to said equal adjacent first code sample value when said quantizing error associated with said preliminary second code sample value is equal to the quantizing error associated with said equal adjacent first code sample value.

6. The coder as defined in claim 5 wherein said first code is pulse code modulation (PCM), said second code is adaptive differential PCM (ADPCM), said quantizer means includes an adaptive quantizer, said linear first code sample generating means includes an inverse PCM quantizer, and said coder further includes a difference circuit supplied with said linear PCM samples and a signal estimate of said linear PCM samples to generate a difference signal, predictor means responsive to a reconstructed signal for generating said signal estimate, said difference signal, said signal estimate and an adaptive scale factor being supplied to said adaptive quantizer for generating an adaptive quantized version of said difference signal (ADPCM code sample) at its output, inverse adaptive quantizer means supplied with said adaptive quantizer output and said adaptive scale factor for generating an inverse adaptive quantized version of said ADPCM output sample, means responsive to said inverse adaptive quantized ADPCM output sample and said ADPCM code sample for generating said adaptive scale factor, and an adder for algebraically combining said signal estimate and said inverse adaptive quantized ADPCM output sample to generate said reconstructed signal.

7. The coder as defined in claim 1 wherein said modifying means includes means for generating a preliminary sample value for each of said second code samples, means for generating second code sample values adjacent to said preliminary second code sample value, means for generating first code sample values for said preliminary and adjacent second code sample values, means for determining whether either of said adjacent first code sample values is equal to said preliminary first code sample value, if neither adjacent first code sample value is equal to the preliminary first code sample value, said second code value is selected to be said preliminary value, means for generating quantizing error values resulting from converting said preliminary second code sample value and said adjacent second code sample value corresponding to said equal adjacent first code sample value from said second code to said first code, means for selecting said adjacent second code sample value corresponding to said equal adjacent first code sample value as said quantizer means second code output sample when said quantizing error for the preliminary second code value is greater than the quantizing error for said equal adjacent first code sample value and for selecting said preliminary second code sample value whtn its associated quantizing error is less than said quantizing error associated with said equal adjacent first code sample value, and means for selecting the more positive value of said preliminary second code sample value and said adjacent second code sample value corresponding to said equal adjacent first code sample value when said quantizing errors associated with said preliminary and equal adjacent first code values are equal.

8. The coder as defined in claim 7 wherein said first code is pulse code modulation (PCM) and said second code is adaptive differential PCM (ADPCM).

9. A coding method for converting digital samples in a first code to digital samples in a second code comprising the steps of,
converting said first code samples into linear versions thereof,
quantizing said linear first code samples to generate said second code samples,
generating a preliminary and adjacent second code sample values, and
controllably modifying values of said second code samples prior to outputting, in accordance with prescribed criteria including selecting between said preliminary and adjacent second code sample values by evaluating at least one second-to-first code conversion quantization error value, so that a next subsequent coder will ultimately generate the same value second code samples.

10. The coding method of claim 9 wherein said quantizing step further includes generating corresponding quantizing error values that would result from converting said preliminary and adjacent second code values into first code samples, and wherein said prescribed criteria includes a first criterion of determining whether said preliminary second code sample value and either of said adjacent second code sample values would generate equal first code values upon conversion to said first code, if not, the second code output sample is selected to be said preliminary value, and, if so, employing a second criterion of determining whether the quantizing error associated with said preliminary second code sample value is equal to or greater than the quantizing error associated with said adjacent second code sample value resulting in the equal first code value upon conversion, if greater than, said adjacent second code sample value is selected as the quantizer second code output sample, if not greater than, said preliminary second code sample is selected as the quantizer second code output and, if equal, the more positive of said preliminary second code sample value and adjacent second code sample value that met the requirement of said first criterion is selected as the quantizer second code output sample.

11. The coding method of claim 10 wherein said first code is pulse code modulation (PCM) and said second code is adaptive differential PCM (ADPCM).

* * * * *